United States Patent [19]

Koike et al.

[11] Patent Number: 4,810,618
[45] Date of Patent: Mar. 7, 1989

[54] PHOTOPOLYMERIZABLE COMPOSITION

[75] Inventors: Mitsuru Koike; Koichi Kawamura, both of Shizuoka, Japan

[73] Assignee: Fuji Photo Film Co., Ltd., Minamiashigara, Japan

[21] Appl. No.: 142,185

[22] Filed: Jan. 11, 1988

[30] Foreign Application Priority Data

Jan. 16, 1987 [JP] Japan .................... 62-7671

[51] Int. Cl.$^4$ .............................................. G03C 1/68
[52] U.S. Cl. .................................... 430/281; 430/915; 430/920; 430/922; 430/919; 430/926; 522/26; 522/27; 522/28; 522/63; 522/65; 522/67
[58] Field of Search ............... 430/281, 915, 920, 922, 430/919, 926; 522/26, 27, 28, 63, 65, 67

[56] References Cited

U.S. PATENT DOCUMENTS

| | | | |
|---|---|---|---|
| 4,147,552 | 4/1979 | Specht et al. | 96/115 |
| 4,239,850 | 12/1980 | Kita et al. | 430/281 |
| 4,258,123 | 3/1981 | Nagashima et al. | 430/281 |
| 4,289,844 | 9/1981 | Specht et al. | 430/281 |
| 4,366,228 | 12/1982 | Specht et al. | 430/281 |
| 4,399,211 | 8/1983 | Kondo et al. | 430/269 |

OTHER PUBLICATIONS

"Ketocoumarins as Photosensitizers and Photoinitiators", Williams et al., Polymer Engineering and Science, Dec. 1983, vol. 23, No. 18.
"Ketocoumarins", Specht et al., Tetrahedron, vol. 38, No. 9, pp. 1203 to 1211, 1982.

Primary Examiner—Paul R. Michl
Assistant Examiner—Susan McBee
Attorney, Agent, or Firm—Burns, Doane, Swecker & Mathis

[57] ABSTRACT

A photopolymerizable composition comprises at least one polymerizable compound having at least one ethylenically unsaturated bond therein and at least one photopolymerization initiator and optionally at least one linear organic high molecular weight polymer and characterized in that the photopolymerization initiator comprises a specific combination of two kinds of compounds, for instance, 2,4,6-tris(trichloromethyl)-s-triazine and compound (12) represented by the following formula:

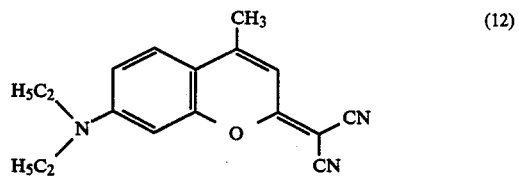

The photopolymerizable composition exhibits a high sensitivity to extremely wide range of actinic rays extending from ultraviolet light to visible light and is useful for manufacturing PS plates and photoresist layer for use in making print circuit-boards or the like.

18 Claims, No Drawings

PHOTOPOLYMERIZABLE COMPOSITION

BACKGROUND OF THE INVENTION

1. Field of the Invention

The present invention relates to a photopolymerizable composition and more particularly to a photopolymerizable composition comprising a polymerizable compound having ethylenically unsaturated bonds and a photopolymerization initiator of a novel composition and optionally a linear organic high molecular polymer, which is useful as, for instance, a light-sensitive layer, which is also sensitive to light from an argon ion laser source, of a presensitized plate for use in making a lithographic printing plate.

2. Description of the Prior Art

It has been well known in the art to form duplicates of images in accordance with a photographic manner employing a light-sensitive composition composed of a polymerizable compound having ethylenically unsaturated bonds and a photopolymerization initiator, which further contains a proper binder capable of forming a film and a heat polymerization inhibitor according to need. As disclosed in U.S. Pat. Nos. 2,927,022; 2,902,356 and 3,870,524, a light-sensitive layer composed of this kind of light-sensitive composition causes photopolymerization and is hardened when it is irradiated with light and thus, the areas exposed to light become insoluble in a developer. Therefore, a desired image can be obtained from such a light-sensitive composition by forming the light-sensitive composition into a proper film, irradiating the film with light through a negative transparency carrying a desired image and then removing only the non-exposed areas by selectively dissolving them with a proper solvent (hereunder simply referred to as "development"). Thus, it is a matter of course that this kind of light-sensitive composition is very useful for the manufacture of a presensitized plate for use in making a lithographic printing plate (hereunder referred to as "PS plate") and the like.

Moreover, it has also been proposed to incorporate, into such a light-sensitive composition, a photopolymerization initiator for the purpose of enhancing the sensitivity to light since if only the polymerizable compound having ethylenically unsaturated bonds is used, the resultant light-sensitive composition hardly exhibits a satisfactory sensitivity to light. Examples of such photopolymerization initiators which have been conventionally used include benzil, benzoin, benzoin ethyl ether, Michler's ketone, anthraquinone, acridine, phenazine, benzophenone and 2-ethylanthraquinone.

However, even if such a photopolymerization initiator is incorporated into this kind of light-sensitive composition, the resultant composition is inferior in the sensitivity to light (or the ability to cause quick hardening) and thus, it takes a long period of time required for irradiating it with light to form images. For that reason, in the case of the reproduction of very fine images, such images exhibiting a good performance cannot be obtained even if there is only a slight vibration in the imagewise exposure operations. In this case, it is further required to increase the dosage of radiant rays from a light source for exposure and, therefore, it is needed to use a means for diffusing a great deal of heat generated during the exposure operation. In addition, there is a strong tendency to cause the deformation of the film formed from the composition and the change in properties thereof because of such extreme heat generation.

Furthermore, these photopolymerization initiators exhibit a rather high ability to cause photopolymerization with respect to light sources emitting light having a wave length of not more than 400 nm (ultraviolet region) while the ability to cause photopolymerization with respect to those emitting light having a wave length of not less than 400 nm (visible light region) is substantially low. Therefore, the application of the photopolymerizable composition containing a conventional photopolymerization initiator is limited to only a very narrow range.

Under such circumstances, there has conventionally been some proposals concerning photopolymerization systems sensitive to visible light. For instance, U.S. Pat. No. 2,850,445 reports that certain kinds of photoreductable dyes such as Rose Bengale, Eosine and Erythrocin exhibit an effective sensitivity to visible light. In addition, as improved techniques thereof, there have been proposed a complex initiator system composed of a dye and an amine (Japanese Patent Publication for Opposition Purpose (hereinafter referred to as "J. P. KOKOKU") No. 44-20189); a system composed of a hexaaryl-bi-imidazole, a radical generator and a dye (J. P. KOKOKU No. 45-37377); a system of a hexaaryl-bi-imidazole and p-dialkylamino-benzylidene ketone (Japanese Patent Un-examined Published Application (hereinafter referred to as "J.P. KOKAI") Nos. 47-2528 and 54-155292); and a system composed of a substituted triazine and a merocyanine dye (J. P. KOKAI No. 54-151024). These systems proposed are certainly sensitive to visible light. However, the light-sensitive composition containing such a photopolymerization system is still insufficient in the photopolymerization velocity (or the sensitivity to light) and, therefore, it has been expected to develop a further improved photopolymerizable composition of this type.

Recently, it has been investigated to improve the light-sensitive composition in its sensitivity to ultraviolet rays and to develop a method for forming images utilizing laser beam and as a result, UV projection exposure methods, direct laser plate making methods, laser facsimile techniques, holography techniques and the like have already been put into practical use. Thus, there have been continued various studies to develop highly sensitive light-sensitive materials which are adapted to the application in such methods and techniques. However, the light-sensitive materials are still insufficient in the sensitivity.

SUMMARY OF THE INVENTION

Accordingly, it is a general purpose of the present invention to provide a photopolymerizable composition exhibiting a high sensitivity to light inclusive of visible light.

More specifically, it is a primary purpose of the present invention to provide a photopolymerizable composition containing a photopolymerization initiator capable of enhancing the photopolymerization velocity of a variety of photopolymerizable composition including in general a polymerizable compound having ethylenically unsaturated bonds therein.

It is another puprose of the present invention to provide a photopolymerizable composition containing a photopolymerization initiator which exhibits a high sensitivity even to light having a wave length of not less than 400 nm (visible light region), in particular to light of around 488 nm corresponding to the output beam of an Ar+ laser.

The inventors of the present invention have conducted various studies to achieve the foregoing purposes and as a result have found that certain specific photopolymerization initiator systems permit the substantial improvement of such a polymerizable compound having ethylenically unsaturated bonds in its photopolymerization velocity and that the resultant composition also exhibits a high sensitivity to visible light of not less than 400 nm by the addition of such a specific photopolymerization initiator. Thus, the present invention has been completed on the basis of the foregoing findings.

Consequently, the present invention relates to a photopolymerizable composition which comprises at least one polymerizable compound having at least one ethylenically unsaturated bond and at least one photopolymerization initiator and optionally at least one linear organic high molecular weight polymer and the composition is characterized in that the photopolymerization initiator comprises at least one 2,4,6-substituted-1,3,5-triazine compound represented by the following general formula (I):

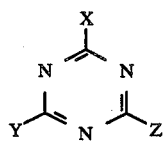
(I)

wherein X, Y and Z each represents an alkyl group, a substituted alkyl group, an aryl group, a substituted aryl group or an aralkyl group with the proviso that these may be identical or different and that at least one of these should be mono-, di- or tri-halomethyl group, and at least one compound represented by the following general formula (II):

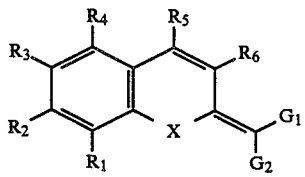
(II)

wherein $R_1$ to $R_4$ each independently represents hydrogen atom, a halogen atom, an alkyl group, a substituted alkyl group, an aryl group, a substituted aryl group, hydroxyl group, an alkoxy group, a substituted alkoxy group, amino group or a substituted amino group with the proviso that $R_1$ to $R_4$ may form a non-metallic ring together with the carbon atoms to which these are bonded; $R_5$ and $R_6$ each independently represents hydrogen atom, an alkyl group, a substituted alkyl group, an aryl group, a substituted aryl group, a heteroaromatic group, an acyl group, cyano group, an alkoxycarbonyl group, carboxyl group or a substituted alkenyl group with the proviso that $R_5$ and $R_6$ may form a non-metallic ring together with the carbon atoms to which these are bonded; X represents oxygen atom, sulfur atom, NH or a bivalent nitrogen atom having a substituent; and $G_1$ and $G_2$ may be identical or different and each represents hydrogen atom, cyano group, an alkoxycarbonyl group, a substituted alkoxycarbonyl group, an aryloxycarbonyl group, a substituted aryloxycarbonyl group, an acyl group, a substituted acyl group, an arylcarbonyl group, a substituted arylcarbonyl group, an alkylthio group, an arylthio group, an alkylsulfonyl group, an arylsulfonyl group or a fluorosulfonyl group with the proviso that $G_1$ and $G_2$ cannot simultaneously represnt hydrogen atom and that these may form a non-metallic ring together with the carbon atoms to which these are bonded.

DETAILED EXPLANATION OF THE INVENTION

The photopolymerizable composition according to the present invention will hereunder be explained in more detail.

The polymerizable compounds having ethylenically unsaturated bonds as used herein are preferably those having at least one ethylenically unsaturated bond in the chemical structure thereof, which may be in any chemical forms such as monomer, prepolymer, i.e., dimer, trimer or an oligomer, or a mixture thereof or a copolymer thereof.

Examples of such monomers and copolymers thereof include unsaturated carboxylic acids and salts thereof, esters of unsaturated carboxylic acids and aliphatic polyol compounds, amides of unsaturated carboxylic acids and aliphatic polyamine compounds, and copolymers of these monomers.

Specific examples of such unsaturated carboxylic acid monomers include acrylic acid, methacrylic acid, itaconic acid, crotonic acid, isocrotonic acid and maleic acid. Examples of the salts of the unsaturated carboxylic acids include sodium and potassium salts of the foregoing unsaturated carboxylic acids.

In addition, as the ester monomers of aliphatic polyol compounds and unsaturated carboxylic acids, there may be mentioned such an acrylate as ethylene glycol diacrylate, triethylene glycol diacrylate, 1,3-butanediol diacrylate, tetramethylene glycol diacrylate, propylene glycol diacrylate, neopentyl glycol diacrylate, trimethylol propane triacrylate, trimethylol propane tri(acryloyloxypropyl)ether, trimethylol ethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol diacrylate, dipentaerythritol triacrylate, dipentaerythritol tetraacrylate, dipentaerythritol hexaacrylate, sorbitol triacrylate, sorbitol tetraacrylate, sorbitol pentaacrylate, sorbitol hexaacrylate, tri(acryloyloxyethyl)-isocyanurate or polyester acrylate oligomers; such a methacrylate as tetramethylene glycol dimethacrylate, triethylene glycol dimethacrylate, neopentyl glycol dimethacrylate, trimethylol propane trimethacrylate, trimethylol ethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate or bis(p-(acryloxyethoxy)-phenyl)-dimethylmethane; such an itaconate as ethylene glycol diitaconate, propylene glycol diitaconate, 1,3-butanediol diitaconate, 1,4-butanediol diitaconate, tetramethylene glycol diitaconate, pentaerythritol diitaconate or sorbitol tetraitaconate; such a crotonate as ethylene glycol dicrotonate, tetramethylene glycol dicrotonate, pentaerythritol dicrotonate, sorbitol tetracrotonate or sorbitol dicrotonate; such an isocrotonate as ethylene glycol diisocrotonate, pentaerythritol diisocrotonate or sorbitol tetraisocrotonate; such a maleate as ethylene glycol dimaleate, triethylene glycol dimaleate, pentaerythritol dimaleate or sorbitol tetramaleate; such a mixture as those of the foregoing ester monomers.

Examples of the amide monomers of aliphatic polyamine compounds and unsaturated carboxylic acids include methylenebis-acrylamide, methylenebis-methacrylamide, 1,6-hexamethylenebis-acrylamide, 1,6-hexamethylenebismethacrylamide, diethylenetriamine trisacrylamide, xylylenebis-acrylamide and xylylenebis-methacrylamide.

It is also possible to use vinylurethane compounds having at least two polymerizable vinyl groups in the molecules obtained by adding a vinyl monomer having a hydroxyl group and represented by the following general formula (III) to a polyisocyanate compound having at least two isocyanate groups in the molecule, as disclosed in J. P. KOKOKU No. 48-41708:

CH$_2$=C(R)COOCH$_2$CH(R')OH    (III)

(wherein R and R' each represents hydrogen atom or methyl group).

In addition to the foregoing compounds, there may be mentioned such urethane acrylates as those disclosed in J. P. KOKOKU Nos. 48-41708 and 50-6034 and J. P. KOKAI No. 51-37193; such polyester acrylates as those disclosed in J. P. KOKAI No. 48-64183 and J. P. KOKOKU Nos. 49-43191 and 52-30490; and such polyfunctional acrylates and methacrylates as epoxy acrylates obtained by reacting an epoxy resin and a (meth)acrylic acid. Moreover, it is also possible to use compounds listed in Bulletin of Japan Adhesives Association (Nippon Setchaku Kyokai Shi), 1984, Vol. 20, No. 7, pp 300–308, as photohardenable monomers and oligomers.

These polymerizable compounds having ethylenically unsaturated bonds may be used alone or in combination and can be used in an amount of 5 to 50% by weight (hereunder simply referred to as "%") on the basis of the total weight of the composition, preferably 10 to 40%.

The photopolymerization initiators, the use of which is the principal characteristics of the photopolymerizable composition of the present invention, will now be explained in detail below.

Specific examples of the 2,4,6-substituted-1,3,5-triazine compounds represented by formula (I) include those disclosed in Wakabayashi et al., Bull. Chem. Soc., Japan, 1969, Vol. 42, 2924, for instance, 2-phenyl-4,6-bis(trichloromethyl)-s-triazine, 2-(4-acetylphenyl)-4,6-bis(trichloromethyl)-s-triazine, 2-(p-chlorophenyl)-4,6-bis(trichloromethyl)-s-triazine, 2-(p-tolyl)-4,6-bis(trichloromethyl)-s-triazine, 2-(p-methoxyphenyl)-4,6-bis(trichloromethyl)-s-triazine, 2-(2',4'-dichlorophenyl)-4,6-bis(trichloromethyl)-s-triazine, 2,4,6-tris(trichloromethyl)-s-triazine, 2-methyl-4,6-bis(trichloromethyl)-s-triazine, 2-n-nonyl-4,6-bis(trichloromethyl)-s-triazine and 2-(alpha,alpha,betatrichloroethyl)-4,6-bis(trichloromethyl)-s-triazine. In addition to these compounds, there may be mentioned such compounds disclosed in British Pat. No. 1,388,492 as 2-styryl-4,6-bis(trichloromethyl)-s-triazine, 2-(p-methylstyryl)-4,6-bis(trichloromethyl)-s-triazine, 2-(p-methoxystyryl)-4,6-bis(trichloromethyl)-s-triazine and 2-(p-methoxystyryl)-4-amino-6-trichloromethyl-s-triazine; such compounds disclosed in J. P. KOKAI No. 53-133428 as 2-(4-methoxy-naphtho-1-yl)-4,6-bis(trichloromethyl 2-(4-ethoxy-naphtho-1-yl)-4,6-bis(trichloromethyl)-s-triazine, 2-(4-(2-ethoxyethyl)-naphtho-1-yl)-4,6-bis(trichloromethyl)-s-triazine, 2-(4,7-dimethoxy-naphtho-1-yl)-4,6-bis(trichloromethyl)-s-triazine and 2-(acenaphtho-5-yl)-4,6-bis(trichloromethyl)-s-triazine; such compounds disclosed in German Pat. No. 3,337,024 and other compounds as those represented by the following formulas:

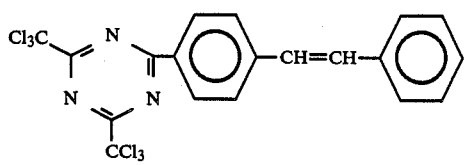

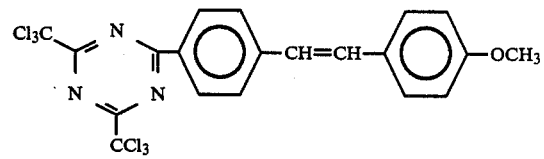

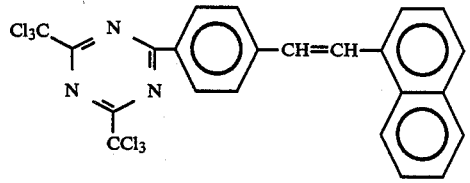

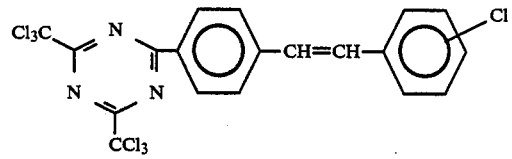

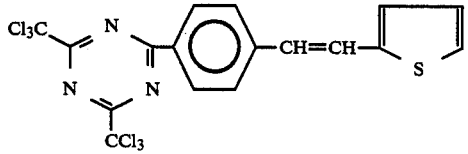

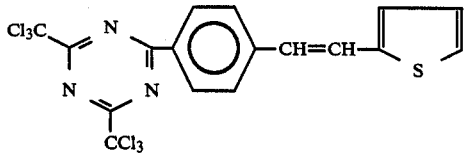

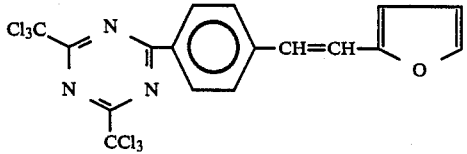

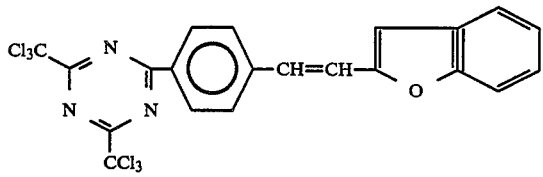

In addition, it is also possible to use compounds disclosed in the article of F. C. Schaefer (J. Org. Chem., 1964, Vol. 29, 1527), for instance, 2-methyl-4,6-bis(tribromomethyl)-s-triazine, 2,4,6-tris(tribromomethyl)-s-triazine, 2,4,6-tris(dibromomethyl)-s-triazine, 2-amino-4-methyl-6-tribromomethyl-s-triazine, and 2-methoxy-4-methyl-6-trichloromethyl-s-triazine.

Moreover, the compounds disclosed in Japanese Patent Application Ser. No. 60-198868 may be used in the present invention and it discloses, for instance, those represented by the following formulas:

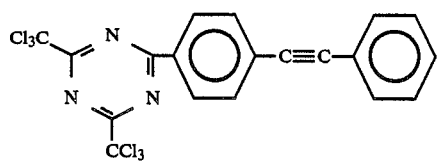

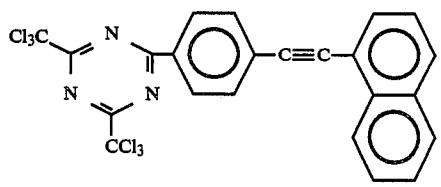

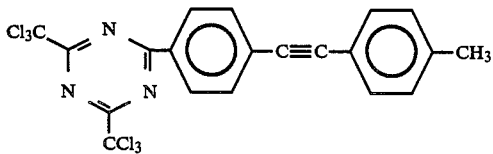

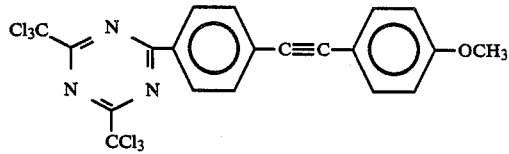

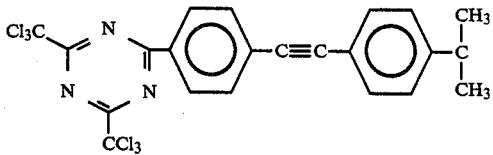

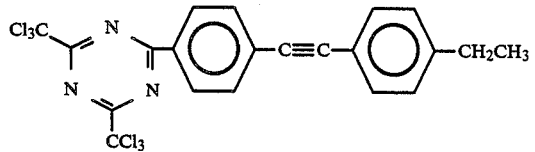

Furthermore, examples of the 2,4,6-substituted-1,3,5-triazines include those disclosed in Japanese Patent Application Ser. Nos. 61-186238 and 61-227489, for instance, the compound represented by the following formula:

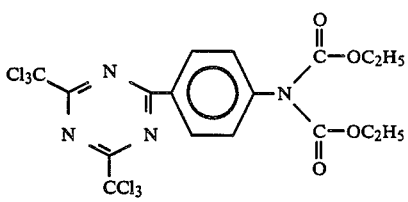

On the other hand, in the photopolymerization initiators represented by the general formula (II), the alkyl groups appearing in the definition of $R_1$ to $R_6$ may be those having 1 to 20 carbon atoms such as methyl, ethyl and tert-butyl groups. The aryl groups in the definition thereof may be those having 6 to 10 carbon atoms such as phenyl group. The alkoxy groups appearing in the definition of $R_1$ to $R_4$ may be those having 1 to 6 carbon atoms such as methoxy, ethoxy and butoxy groups.

The substituted amino groups included in the definition of $R_1$ to $R_4$ may be alkylamino groups having 1 to 20 carbon atoms or arylamino groups having 6 to 20 carbon atoms such as methylamino, dimethylamino, diethylamino, diphenylamino, piperidino and morpholino groups.

These alkyl, aryl, alkoxy, alkylamino and arylamino groups may have substituents and examples of such substituents include such a halogen atom as fluorine, chlorine or bromine atom; such an alkoxycarbonyl group as ethoxycarbonyl group; such an alkoxy group as methoxy or ethoxy group; such an aryl group as phenyl group; and cyano group.

When $R_1$ to $R_4$ form a non-metallic ring together with the carbon atoms to which they are bonded, examples of compounds (II) including such a ring are those represented by the following general formulas (A) to (C):

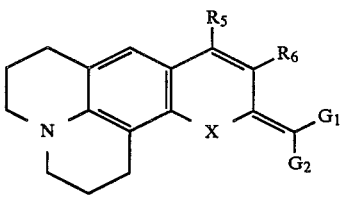
(A)

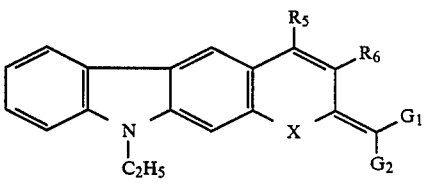
(B)

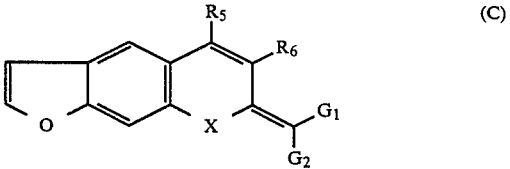
(C)

wherein each substituent has the same meanings as defined above.

When $R_5$ and $R_6$ are acyl groups, examples thereof include those having alkyl groups of 1 to 10 carbon atoms or aryl groups of 6 to 10 carbon atoms and if they are alkoxycarbonyl groups, examples thereof are those having an alkyl group of 1 to 6 carbon atoms such as ethoxycarbonyl group. Furthermore, if they are substituted alkenyl groups, these may be those having 2 to 10 carbon atoms such as styryl group. If these groups are heteroaromatic groups, examples thereof include those represented by the following formulas (D) to (F):

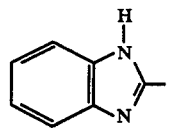
(D)

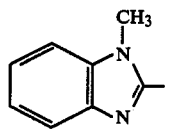
(E)

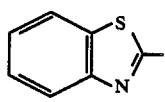
(F)

As explained above, $R_5$ and $R_6$ may form a non-metallic ring together with the carbon atoms to which these are bonded. Examples of compounds (II) containing such a ring are those represented by the following general formula (G):

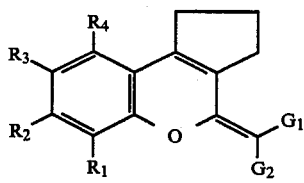
(G)

(wherein each substituent has the same meaning as defined above).

If X is a nitrogen atom having a substituent, examples of such substituents include the same alkyl and aryl groups as those listed above in connection with $R_1$ to $R_6$.

$G_1$ and $G_2$ may be identical or different and each represents hydrogen atom, cyano group, an alkoxycarbonyl group having an alkyl group of 1 to 10 carbon atoms such as ethoxycarbonyl group, and aryloxycarbonyl group having an aryl group of 6 to 10 carbon atoms such as phenoxycarbonyl group, an acyl group having 1 to 6 carbon atoms such as acetyl or propionyl group, an arylcarbonyl group having 7 to 11 carbon atoms such as benzoyl group, an alkylthio group having 1 to 6 carbon atoms such as methylthio or ethylthio group, an arylthio group having 6 to 10 carbon atoms such as phenylthio group, an arylsulfonyl group having 6 to 10 carbon atoms such as phenylsulfonyl group, an alkylsulfonyl group having 1 to 6 carbon atoms such as methylsulfonyl or ethylsulfonyl group, or a fluorosulfonyl group.

These alkoxycarbonyl, aryloxycarbonyl, acyl, arylcarbonyl, alkylthio, arylthio, arylsulfonyl and alkylsulfonyl groups appearing in the definition of $G_1$ and $G_2$ may have substituents, examples of which include such halogen atoms as chlorine; alkoxycarbonyl groups having an alkyl group of 1 to 6 carbon atoms; carboxyl group; aryl groups having 6 to 10 carbon atoms; alkoxy groups having 1 to 6 carbon atoms; and cyano group. In addition, in the case of aryloxycarbonyl, arylcarbonyl, arylthio or arylsulfonyl groups, these groups may be substituted with alkyl groups having 1 to 6 carbon atoms such as methyl group, in addition to the foregoing substituents.

As explained above, $G_1$ and $G_2$ may form a ring of non-metallic atoms together with the carbon atoms to which these are bonded. Such a ring is usually used as an acidic nucleus of merocyanine dyes and examples thereof include as follows:

(a) 1,3-dicarbonyl nucleus, for instance, 1,3-indanedione, 1,3-cyclohexanedione, 5,5-dimethyl-1,3-cyclohexanedione and 1,3-dioxane-4,6-dione;

(b) pyrazolinone nucleus, for instance, 3-methyl-1-phenyl-2-pyrazolin-5-one, 1-phenyl-2-pyrazolin-5-one and 1-(2-benzothiazoyl)-3-methyl-2-pyrazolin-5-one;

(c) isoxazolinone nucleus, for instance, 3-phenyl-2-isoxazolin-5-one and 3-methyl-2-isoxazolin-5-one;

(d) oxyindole nucleus, for instance, 1-alkyl-2,3-dihydro-2-oxyindole;

(e) 2,4,6-triketohexahydropyrimidine nucleus, for instance, barbituric acid, 2-thiobarbituric acid and derivatives thereof, examples of such derivatives including 1-alkyl derivatives such as 1-methyl and 1-ethyl derivatives, 1,3-dialkyl derivatives such as 1,3-diethyl and 1,3-dibutyl derivatives, 1,3-diaryl derivatives such as 1,3-diphenyl, 1,3-di-(p-chlorophenyl) and 1,3-di-(p-ethoxycarbonylphenyl) derivatives, and 1-alkyl-3-aryl derivatives such as 1-ethyl-3-phenyl derivatives;

(f) 2-thio-2,4-thiazolidinedione nucleus, for instance, rhodanine and derivatives thereof, examples of such derivatives including 3-alkylrhodanines such as 3-ethylrhodanine and 3-allylrhodanine, and 3-arylrhodanines such as 3-phenylrhodanine;

(g) 2-thio-2,4-oxazolidinedione-(2-thio-2,4-(3H,5H)-oxazoledione nucleus, for instance, 2-ethyl-2-thio-2,4-oxazolidinedione;

(h) thianaphthenone nucleus, for instance, 3-(2H)-thianaphthenone and 3-(2H)-thianaphthenon-1,1-dioxide;

(i) 2-thio-2,5-thiazolidinedione nucleus, for instance, 3-ethyl-2-thio-2,5-thiazolidinedione;

(j) 2,4-thiazolidinedione nucleus, for instance, 2,4-thiazolidinedione, 3-ethyl-2,4-thiazolidinedione and 3-phenyl-2,4-thiazolidinedione;

(k) thiazolidinone nucleus, for instance, 4-thiazolidinone and 3-ethyl-4-thiazolidinone;

(l) 4-thiazolinone nucleus, for instance, 2-ethylmercapto-5-thiazolin-4-one and 2-alkylphenylamino-5-thiazolin-4-one;

(m) 2-imino-2-oxozolin-4-one nucleus (pseudo-hydantoin nucleus);

(n) 2,4-imidazolidinedione (hydantoin) nucleus, for instance, 2,4-imidazolidinedione and 3-ethyl-2,4-imidazolidinedione;

(o) 2-thio-2,4-imidazolidinedione (2-thiohydantoin) nucleus, for instance, 2-thio-2,4-imidazolidinedione and 3-ethyl-2-thio-2,4-imidazolidinedione;

(p) 2-imidazolin-5-one nucleus, for instance, 2-n-propylmercapto-2-imidazolin-5-one; and (q) furan-5-one nucleus.

The photopolymerization initiators represented by the general formula (II) which can be used in the composition of the present invention may be prepared by reacting a compound represented by the following general formula (IV) or (V) with a compound represented by the following general formula (VI):
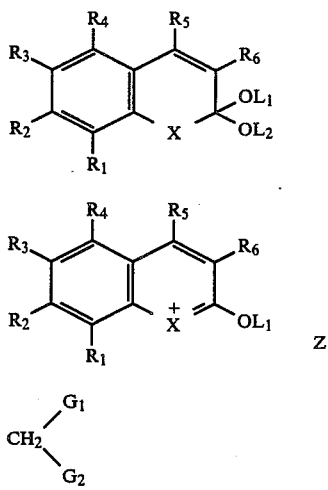
in the above general formulas, $L_1$ and $L_2$ each represents an alkyl group and $Z^-$ represents an anion.
Specific examples of the photopolymerization initiators represented by the general formula (II) are as follows:
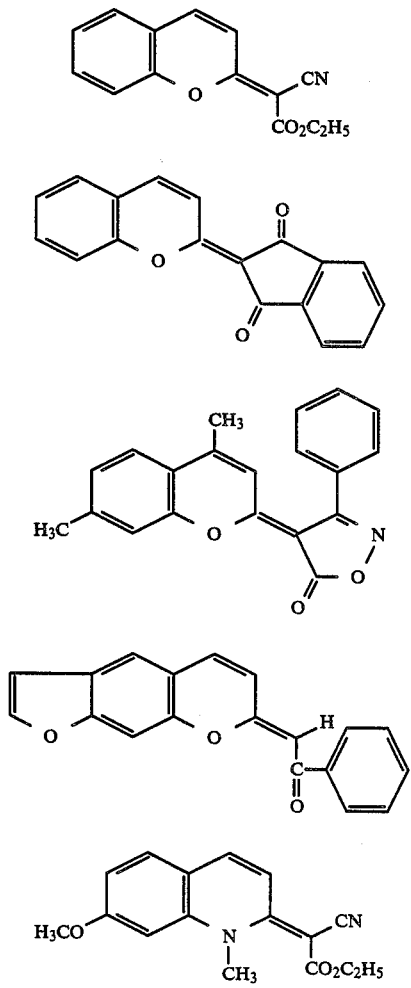
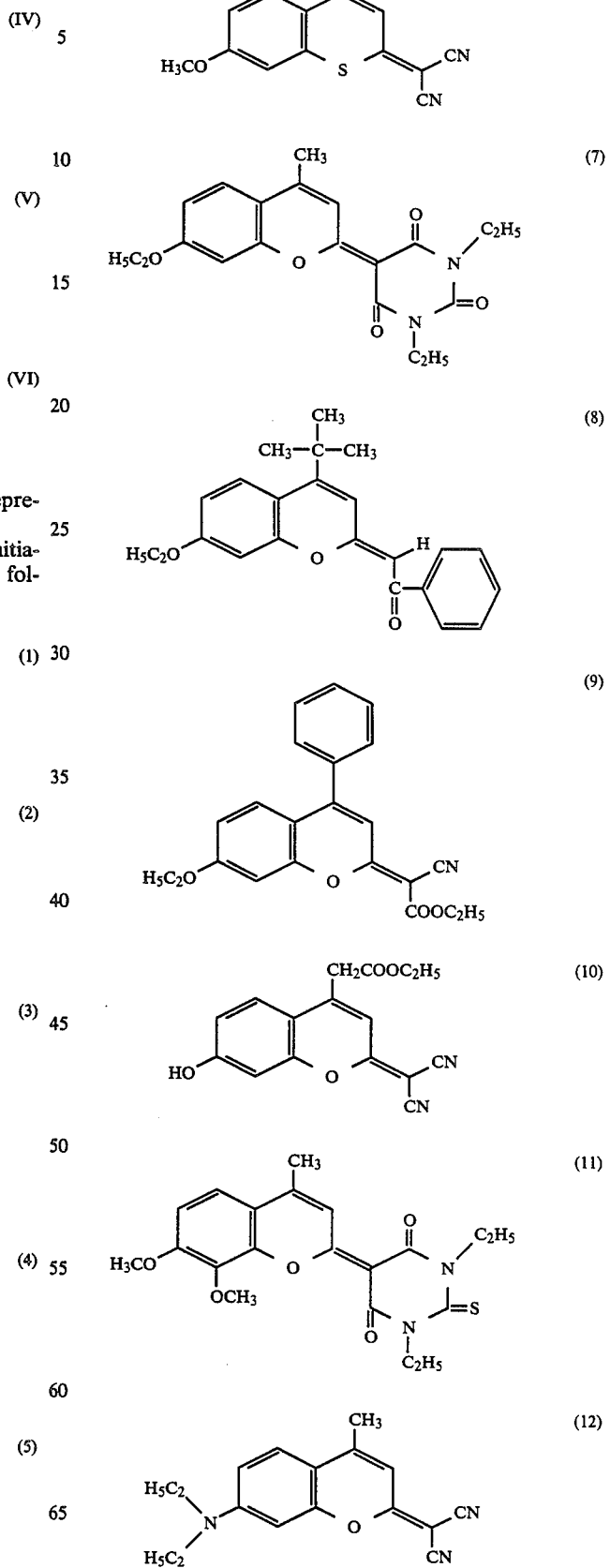

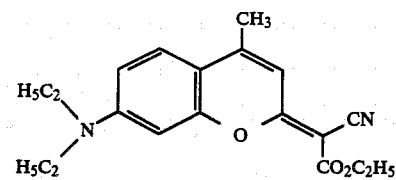 (13)
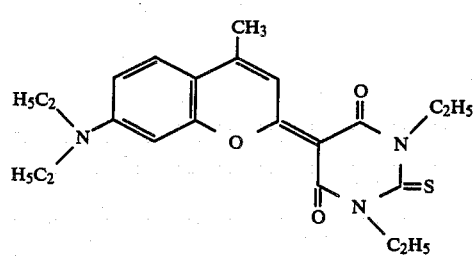 (14)
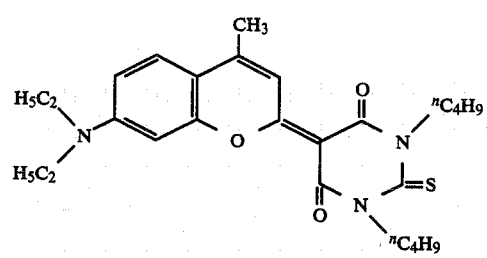 (15)
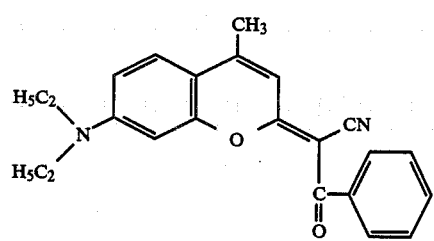 (16)
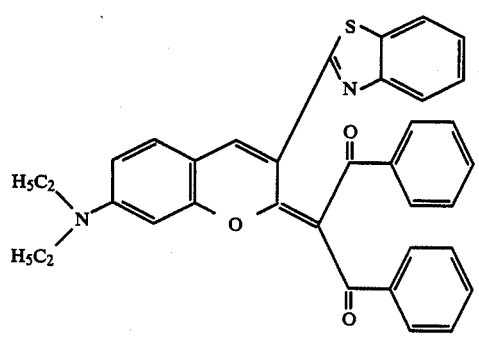 (17)
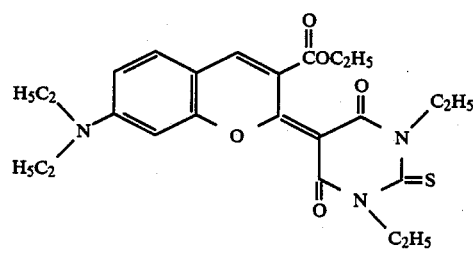 (18)
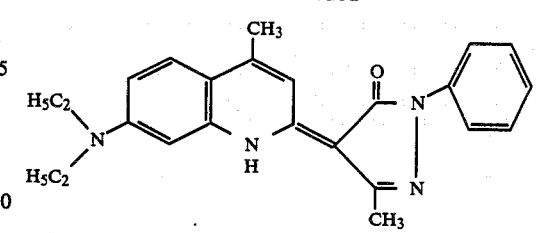 (19)
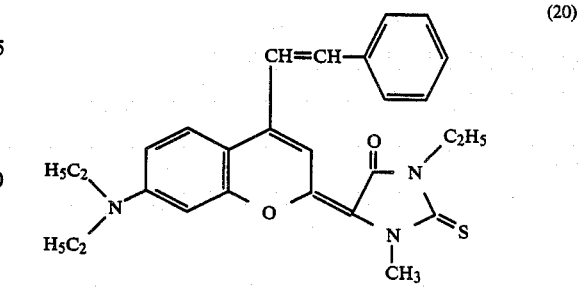 (20)
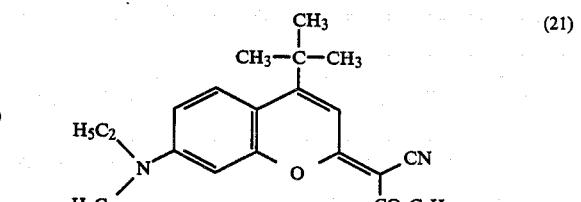 (21)
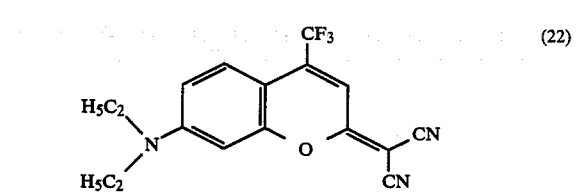 (22)
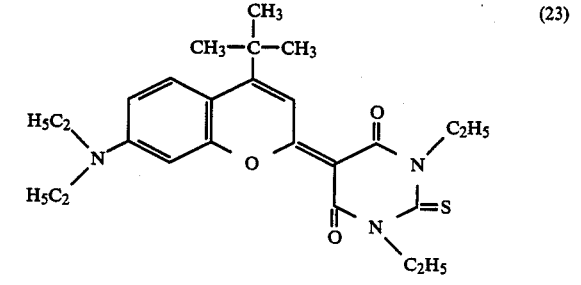 (23)
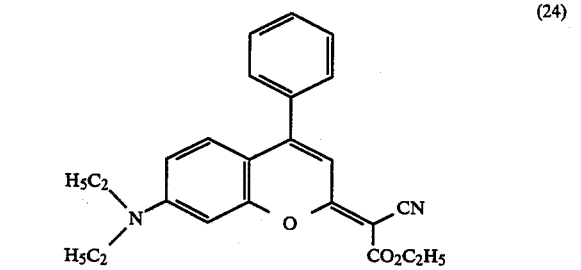 (24)

-continued
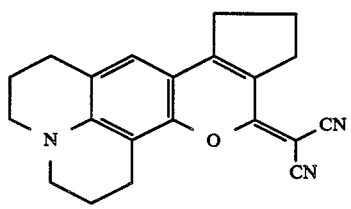 (25)
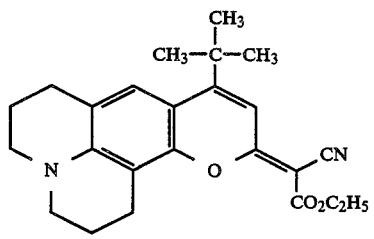 (26)
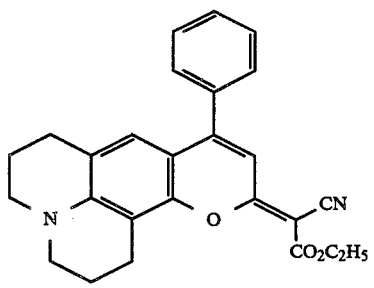 (27)
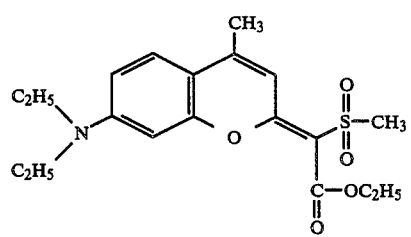 (28)
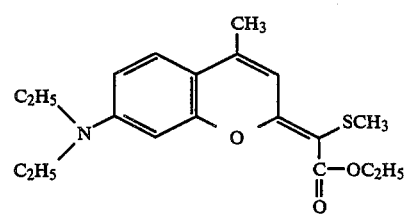 (29)
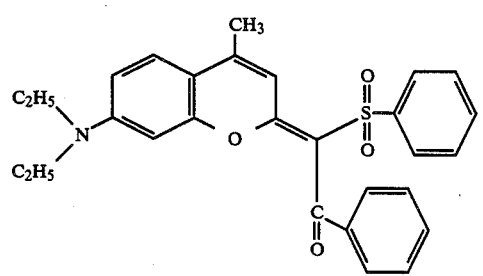 (30)
-continued
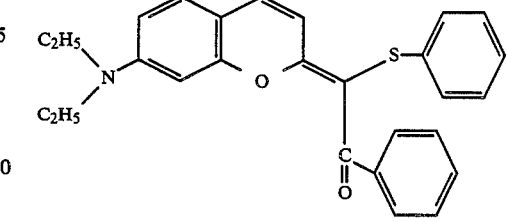 (31)
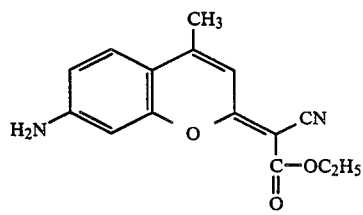 (32)
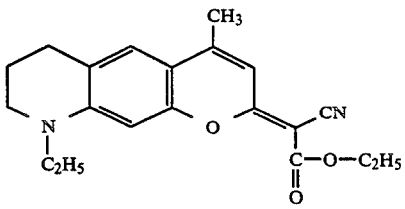 (33)
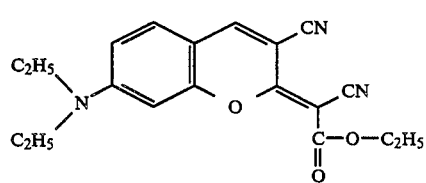 (34)
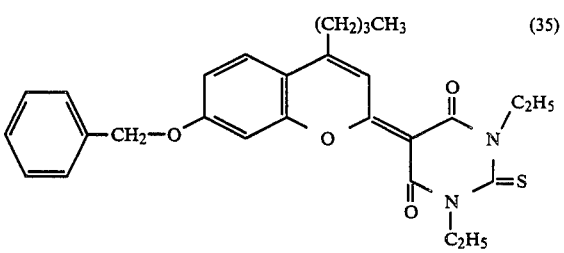 (35)
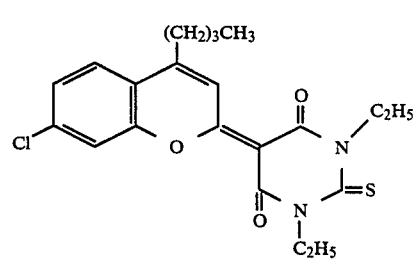 (36)
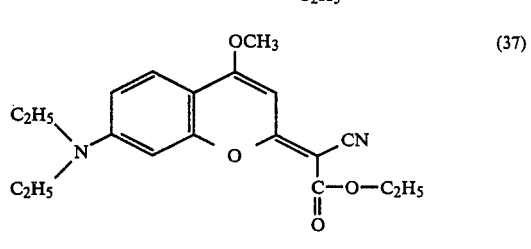 (37)

A weight ratio of the compound of formula (I) to the compound of formula (II) contained is the initiator systems is suitably 10:1 to 1:10, preferably 5:1 to 1:5.

These photopolymerization initiator systems are usually incorporated into the photopolymerizable composition of the present invention in a very small amount. The use of these systems in an extremely large amount leads to undesirable results such as the shielding of effective radiant rays. The amount of these photopolymerization initiator systems in the photopolymerizable composition of the present invention preferably ranges from 0.01 to 60% with respect to the total amount of the photopolymerizable ethylenically unsaturated compound and a linear organic high molecular weight polymer which is incorporated thereinto according to need. Particularly preferred amount thereof falls within the range of from 1 to 30%, which provides good results.

Further, the photopolymerizable composition of the present invention may contain a variety of organic amine compounds according to need for the purpose of further enhancing the photopolymerization initiating ability of the composition. Examples of such organic amine compounds include triethanolamine, dimethylamine, diethanolaniline, ethyl p-dimethylaminobenzoate and Michler's ketone. The organic amine compounds may be used alone or in combination and these compounds are used in an amount of about 50 to about 200% on the basis of the total weight of the photopolymerization initiators.

For the purpose of further enhancing the photopolymerization initiating ability of the photopolymerization initiators, it is also possible to add at least one compound serving as a proton donor such as N-phenylgylcine, 2-mercaptobenzothiazole and alkyl N,N-dialkylbenzoates according to need. The amount of such proton donating compounds ranges from about 50 to about 100% with respect to the total amount of the photopolymerization initiators.

The "linear organic high molecular weight polymers" which can be used in the composition of the present invention are not limited to specific examples so far as the polymers exhibit good compatibility with the photopolymerizable ethylenically unsaturated compound. However, it is desirable to select a linear organic high molecular weight polymer soluble in water or weak alkaline aqueous solution or capable of swelling therein, which makes it possible to develop layers of the composition with water or a weak alkali aqueous solution as a developer. The linear organic high molecular weight polymers are used as film forming agents or are properly selected in accordance with the nature of the developer selected. For instance, the composition can be developed with water if a water soluble organic high molecular weight polymer is used. Examples of these linear organic high molecular weight polymers are such addition polymers having carboxylic acid groups on the side chains thereof as methacrylic copolymers, acrylic copolymers itaconic copolymers, crotonic copolymers, maleic copolymers, and partially esterified maleic copolymers (see, for example, J. P. KOKAI Nos. 59-44615, 54-92723, 59-53836 and 59-71048 and J. P. KOKOKU Nos. 54-34327, 58-12577 and 54-25957). Moreover, acidic cellulose derivatives having carboxyl groups on the side chains thereof are also useful in this invention. Besides, those obtained by adding cyclic aicd anhydrides to addition polymers having hydroxyl groups are also useful. Among these, particularly preferred are copolymers of benzyl (meth)acrylate, (meth)acrylic acid and optional another addition polymerizable vinyl monomer and copolymers of allyl (meth)acrylate, (meth)acrylic acid and optional another addition polymerizable vinyl monomer. In addition to the aforementioned examples, as the water soluble linear organic high molecular weight polymers, there may be named, for instance, polyvinyl pyrrolidone and polyethylene oxide. In addition, alcohol-soluble nylon, polyethers of 2,2-bis(4-hydroxyphenyl)-propane and epichlorohydrin and the like are useful in order to enhance the strength of the hardened film.

These linear organic high molecular weight polymers may be incorporated in the photopolymerizable composition of the invention in any amount. However, the use of such polymers in an amount more than 90% impairs the properties such as the strength of the resultant images. Therefore, it is preferable to use the same in an amount of about 30 to about 85%. In addition, it is preferable that the ratio of the photopolymerizable ethylenically unsaturated compound to the linear organic high molecular polymer be in the range of from 0.5/9.5 to 5/5 (weight ratio) and particularly preferred ratio therebetween falls within the range of from 1/9 to 4/6.

Further, it is desirable to add to the composition of the present invention a small amount of a heat polymerization inhibitor other than the aforementioned essential components, for the purpose of undesired premature heat polymerization of the polymerizable ethylenically unsaturated compound possibly encountered during the manufacture of the light-sensitive composition or the storage thereof. Examples of suitable heat polymerization inhibitors include hydroquinone, p-methoxyphenol, di-tert-butyl-p-cresol, pyrogallol, tert-butylcatechol, benzoquinone, 4.4'-thiobis(3-methyl-6-tert-butylphenol), 2,2'-methylenebis(4-methyl-6-tert-butylphenol), 2-mercaptobenzoimidazol, cerium(III) N-nitrosophenylhydroxylamine. The preferred amount of the heat polymerization inhibitors ranges from about 0.01 to about 5% on the basis of the total weight of the photopolymerization composition.

In order to prevent the polymerization inhibitory effect due to the presence of oxygen, a higher aliphatic acid derivative may optionally be added so as to float on the surface of the composition. The amount thereof preferably ranges from about 0.5 to about 10% on the basis of the total amount of the composition.

Further, a dye or a pigment may be added to the composition for the purpose of coloring the resultant light-sensitive layer and the amount thereof is in the range of from about 0.5 to about 5% with respect to the total amount of the composition.

Moreover, inorganic fillers and other known additives may also be added to the composition in order to improve the physical properties of the resulting hardened film.

The photopolymerizable composition of the present invention is used in the form of a solution in a variety of organic solvents. Examples of solvents usable in the present invention include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, ethylene glycol monoethyl ether, acethyl acetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide gamma-butylolactone. These solvents may be used alone or in combination. The proper concentration of the solid material (solid content) of the coating solution ranges from 2 to 50%.

The coated amount thereof is in the range of from 0.1 to 10 g/m$^2$ (dry weight), and particularly preferred amount thereof is in the range of from 0.5 to 5 g/m$^2$.

The coating solution of the photopolymerizable composition of the present invention is in general applied to the surface of a proper substrate to form, for instance, PS plates. As such a substrate, a plate-like material which has a good dimensional stability is in general used in the present invention. Examples of such a dimensionally-stable plate-like material include paper, paper laminated with a plastic film such as polyethylene, polypropylene or polystyrene film, such a metallic plate as aluminum plate (inclusive of aluminum alloy plates), a zinc plate or a copper plate, such a plastic film as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal film, and paper or plastic film on which a layer of the foregoing metal is deposited. Among these, the aluminum plate is particularly preferable because of its high dimensional stability and low cost. Moreover, it is also preferable to use a composite sheet comprised of polyethylene terephthalate film to which an aluminum sheet is attached, such as those disclosed in J. P. KOKOKU No. 48-18327.

In this connection, if a substrate having a surface of metal, in particular, aluminum is used, it is preferable that such a substrate be subjected to a surface treatment such as graining, dipping treatment in an aqueous solution of, for instance, sodium silicate, potassium fluorozirconate or a phosphate, or anodization treatment.

In addition, examples of preferred substrates include an aluminum plate which is grained followed by dipping in an aqueous solution of sodium silicate; and an aluminum plate which is anodized followed by dipping in an aqueous solution of an alkali metal silicate. In this respect, the anodization can be carried out by passing an electric current through the aluminum plate serving as the anode in an electrolyte comprising an aqueous solution or a nonaqueous solution or a combination thereof containing an inorganic acid such as phosphoric acid, chromic acid, sulfuric acid or boric acid, an organic acid such as oxalic acid or sulfamic acid or a salt thereof.

Furthermore, it is also effective to employ silicate electrodeposition technique such as that disclosed in U.S. Pat. No. 3,658,662.

In addition, it is also effective to further anodizing and treating, with a sodium silicate solution, a substrate which has been subjected to electrolytic graining and is disclosed in J. P. KOKOKU No. 46-27481 and J. P. KOKAI Nos. 52-58602 and 52-30503.

Moreover, an aluminum plate or a substrate having an aluminum surface may be subjected to, in order, a mechanical surface roughening treatment, a chemical etching treatment, an electrolytic graining, an anodization treatment and further a sodium silicate treatment and the substrate thus prepared is also preferably used in the present invention.

Preferred examples of substrate further include aluminum substrates inclusive of those having an aluminum surface, to which an undercoating layer is applied. Examples of such undercoatings include such a water-soluble resin as polyvinyl sulfonic acid, a polymer or copolymer having sulfonic acid groups on the side chains thereof or polyacrylic acid; such a water-soluble metal salt as zinc borate; an yellow dye; or an amine salt.

These hydrophilization treatments are effected not only to make the surface of the substrate hydrophilic but also to prevent occurrence of a possible harmful reaction of the photopolymerizable composition as well as to enhance the adherence of the light-sensitive layer with respect to the surface of the substrate.

A protective layer may be formed on the layer of the photopolymerizable composition of the invention, which is applied to the surface of a substrate, in order to eliminate the polymerization inhibitory effect of oxygen in air. Such protective layer may be obtained from a polymer excellent in oxygen shielding effect, such as polyvinyl alcohol and cellulose acetate. As to the method for applying such a protective layer onto the layer of the composition, reference can be made to, for instance, U.S. Pat. No. 3,458,311 and J. P. KOKOKU No. 55-49729.

The photopolymerizable composition of the present invention may effectively be used in the usual photopolymerization reactions. In addition to such application, it may be used in various fields, for instance, it may be applicable as a photoresist for use in making printed plates and print circuit-boards. In particular, a good result is expected if it is used as the light-sensitive materials which are exposed to light from visible lasers such as Ar$^+$ laser because of its high sensitivity and wide spectral sensitivity extending up to visible range.

When the photopolymerizable composition of the present invention is used to obtain a lithographic printing plate, the PS plate having, thereon, provided with a light-sensitive layer of the composition is first exposed to light and then the non-exposed areas thereof are removed with a developer to form images and thus the lithographic printing plate is obtained. Examples of developers usable in preparing such a lithographic printing plate are those disclosed in J. P. KOKOKU No. 57-7472, i.e., an aqueous solution of an inorganic alkali agent such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate or aqueous ammonia; or such an organic alkali agent as monoethanol amine or diethanol amine. The amount of these alkali agents in the developer ranges from 0.1 to 10%, preferably 0.5 to 5%.

These alkaline aqueous solutions may include a surfactant and/or an organic solvent such as benzyl alcohol, 2-phenoxy ethanol or 2-butoxy ethanol in a small amount. Examples of such developers are disclosed in U.S. Pat. Nos. 3,475,171 and 3,615,480. In addition, the developers such as those disclosed in J. P. KOKAI Nos. 50-26601 and 58-54341 and J. P. KOKOKU Nos. 56-39464 and 56-42860 are also excellent.

From the foregoing detailed descriptions, it is clear that the photopolymerizable composition of the present invention exhibits a high sensitivity to extremely wide range of actinic rays extending from ultraviolet light to visible light. Therefore, the composition of the invention may be highly sensitive to light from a variety of light sources such as super high pressure, high pressure, medium pressure or low pressure mercury lamps, chemical lamp, carbon arc lamp, xenon lamp and metal halide lamps, various kinds of laser lamps emitting light, the wave length of which ranges from visible to ultraviolet light, fluorescent lighting and solar rays.

The photopolymerizable composition of the present invention will hereunder be explained in more detail with reference to the following non-limitative working examples and the effects practically attained according to the composition of the present invention will also be discussed in detail in comparison with comparative examples.

EXAMPLES 1 TO 6

The surface of an aluminum plate of 0.03 mm thick was grained with a nylon brush and an aqueous suspension of pumice stone having a particle size of 400 mesh and then was washed with water sufficiently. The aluminum plate was further etched by immersing it in 10% aqueous solution of sodium hdyroxide at 70° C. for 60 seconds, followed by washing with running water, neutralizing and washing with 20% nitric acid and then washing with water. The aluminum plate was then subjected to an electrolytic surface roughening treatment, in 1% aqueous solution of nitric acid, at the anode time electricity of 160 coulomb/dm$^2$ using an alternating waved current of sign wave under $V_A=12.7$ V. The surface roughness thereof was determined and was found to be 0.6 microns expressed as Ra. Subsequently, the aluminum plate was desmutted by immersing it in 30% aqueous solution of sulfuric acid at 55° C. for 2 minutes and thereafter it was anodized in 20% aqueous solution of sulfuric acid at a current density of 2 A/dm$^2$ so as to reduce the thickness thereof to 2.7 g/m$^2$.

A light-sensitive layer was formed by applying, onto the surface of the aluminum plate thus treated, the light-sensitive liquid having the following composition so that the coated amount thereof was equal to 1.5 g/m$^2$ (dry weight) and then drying.

| Component | Amount used (g) |
|---|---|
| Trimethylolpropane tri(acryloyl-oxypropyl)-ether | 2.0 |
| Allyl Metacrylate/Metacrylic Acid Copolymer (molar ratio = 80/20) | 2.0 |
| Photopolymerization Initiator | X (see Table I) |
| Copper Phthalocyanine Pigment | 0.2 |
| Fluorine Nonionic Surfactant (manufactured and sold by 3M Corporation under the trade name of FLUORAD FC-430) | 0.03 |
| Methyl Ethyl Ketone | 20 |
| Propylene Glycol Monomethyl Ether Acetate | 20 |

On the light-sensitive layer thus formed, an aqueous solution of 3% by weight of polyvinyl alcohol (degree of saponification=86.5 to 89 mole%; degree of polymerization=1,000) was applied so that the dry weight thereof was 2 g/m$^2$ and then was dried at 100° C. for 2 minutes.

Test for determining sensitivity to visible light was effected utilizing monochromatic light, i.e., visible light (wave length=488 nm) and light from Ar$^+$ laser (wave length=488 nm). The monochromatic light, visible light of 488 nm, was obtained by filtering the light from a tungsten lamp through a filter (Kento Optical Filter BP49). The measurement of the sensitivity was carried out employing Fuji PS Step Guide (manufactured and sold by Fuji Photo Film Co., Ltd.; a step tablet having 15 steps, the optical transmission density of the first step being 0.05 and the density difference between each neighbouring two steps being 0.01). The light-sensitive layer was exposed to the monochromatic visible light of 488 nm for 120 seconds so that the intensity of illumination was 25 Lux on the image areas and the resulting number of clear steps of the PS Step Guide observed after development was listed in Table I.

The laser rays was the single line from Ar$^+$ laser of 488 nm (Ar$^+$ Laser Model 95-3; available from LEXEL Corporation) and the beam size thereof was 100 microns. The laser rays were scanned on the light-sensitive layer while changing the strength of the Ar$^+$ laser (an ND filter was used). After development, the resultant line width was measured. In this connection, the sensitivity was defined as the strength of the Ar$^+$ laser at the time when the line of 100 microns wide was reproduced and the results obtained were summarized in Table I.

The development of the exposed light-sensitive layer was effected by immersing it into the developer having the following composition at 25° C. for 1 minute.

| Component | Amount (g) |
|---|---|
| 1K Potassium Silicate | 30 |
| Potassium Hydroxide | 15 |
| Compound A | 3 |
| Water | 1000 |

Compound A:

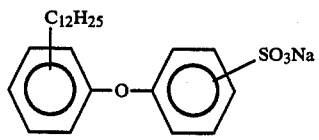

The results of the sensitivity measurement observed when different kinds of the photopolymerization initiator systems were used are summarized in Table I.

TABLE I

| | | | Sensitivity | |
|---|---|---|---|---|
| | Photopolymerization Initiator | | Steps (1) | LRS (2) |
| Ex. No. | | | | |
| 1 | 2,4,6-tris(trichloro-methyl)-s-triazine | 0.1 g | 6.0 | 2.8 |
| | Compound No. 12 | 0.1 g | | |
| 2 | 2,4,6-tris(trichloro-methyl)-s-triazine | 0.1 g | 6.5 | 2.5 |

TABLE I-continued

| | Photopolymerization Initiator | | Sensitivity Steps (1) | LRS (2) |
|---|---|---|---|---|
| 3 | Compound No. 13<br>2-(p-methoxyphenyl)-4,6-bis(trichloromethyl)-s-triazine | 0.1 g<br>0.1 g | 4.0 | 6.0 |
| 4 | Compound No. 16<br>2-methyl-4,6-bis(trichloromethyl)-s-triazine | 0.1 g<br>0.1 g | 4.0 | 6.0 |
| 5 | Compound No. 12<br>2-phenyl-4,6-bis(trichloromethyl)-s-triazine | 0.1 g<br>0.1 g | 5.2 | 3.9 |
| 6 | Compound No. 15<br>2-(p-tolyl)-4,6-bis(trichloromethyl)-s-triazine | 0.1 g<br>0.1 g | 5.0 | 3.0 |
| Comp. Examples | Compound No. 16 | 0.1 g | | |
| 1 | 2,4,6-tris(trichloromethyl)-s-triazine | 0.1 g | N.I. | 600< |
| 2 | 2-(p-methoxyphenyl)-4,6-bis(trichloromethyl)-s-triazine | 0.1 g | N.I. | " |
| 3 | 2-methyl-4,6-bis(trichloromethyl)-s-triazine | 0.1 g | N.I. | " |
| 4 | 2-phenyl-4,6-bis(trichloromethyl)-s-triazine | 0.1 g | N.I. | " |
| 5 | 2-(p-tolyl)-4,6-bis(trichloromethyl)-s-triazine | 0.1 g | N.I. | " |
| 6 | Compound No. 12 | 0.1 g | N.I. | " |
| 7 | Compound No. 13 | 0.1 g | N.I. | " |
| 8 | Compound No. 15 | 0.1 g | N.I. | " |
| 9 | Compound No. 16 | 0.1 g | N.I. | " |

(1): Number of the clear steps observed when the monochromatic light obtained through the BP-49 filter was used.
(2): Sensitivity expressed as mJ/cm², observed when laser rays was used (LRS).
N.I.: No images was formed.

As seen from the results listed in Table I, it is found that the compositions in Examples 1 to 6 exhibit extremely high sensitivity as compared to those in Comparative Examples 1 to 9.

EXAMPLES 7 TO 9

A PS plate was prepared by applying the following light-sensitive liquid having the following formulation onto an aluminum plate which had been treated according to procedures similar to those in Examples 1 to 6 except that, in place of subjecting it to anodization treatment in 20% $H_2SO_4$ aqueous solution, it was anodized, in 5% phosphoric acid aqueous solution, at a current density of 2 A/dm² for 2 minutes so as to reduce the thickness thereof to 0.8 g/m² and then was treated in 3% aqueous solution of sodium silicate at 70° C. for 10 seconds.

| Formulation of the Light-sensitive Liquid | |
|---|---|
| Pentaerythritol Tetraacrylate | 1.5 g |
| Benzyl Methacrylate/Methacrylic Acid Copolymer (molar ratio = 65/35) | 3.0 g |
| Photopolymerization Initiator | X g (see Table II) |
| Copper Phthalocyanine Pigment | 0.2 g |
| Fluorine Nonionic Surfactant (manufactured and sold by 3M Corporation under the trade name of FLUORAD FC-430) | 0.03 g |
| Methyl Ethyl Ketone | 20 g |
| Propylene Glycol Monomethyl Ether Acetate | 20 g |

The coated amount of the composition was 1.5 g/m² (dry weight). As in Examples 1 to 6, an oxygen shielding layer of polyvinyl alcohol was formed on the light-sensitive layer, the resultant light-sensitive layer was exposed to light according in the same manner as in Examples 1 to 6 and then was developed. The development was effected by immersing it in the developer, disclosed in J.P. KOKOKU No. 56-42860 and having the following composition, at 25° C. for 1 minute to remove the non-exposed areas:

| | |
|---|---|
| Sodium Sulfite | 3 g |
| Benzyl Alcohol | 30 g |
| Triethanol Amine | 20 g |
| Monoethanol Amine | 5 g |
| Sodium tert-Butyl Naphthalene Sulfonate (manufactured and sold by Kao Atras Co., Ltd. under the trade name of PEREX NBL) | 30 g |
| Water | 1000 g |

The results of the sensitivity measurement observed when different kinds of the photopolymerization initiator systems were employed are summarized in Table II.

TABLE II

| Ex. No. | Photopolymerization Initiator | | Sensitivity Steps(1) | LRS(2) |
|---|---|---|---|---|
| 7 | 2,4,6-tris(trichloromethyl)-s-triazine<br>Compound No. 13 | 0.1 g<br>0.1 g | 6.0 | 2.8 |
| 8 | 2-(p-chlorophenyl)-4,6-bis(trichloromethyl)-s-triazine<br>Compound No. 16 | 0.1 g<br>0.1 g | 6.5 | 2.5 |
| 9 | 2-(4-acetylphenyl)-4,6-bis(trichloromethyl)-s-triazine<br>Compound No. 12 | 0.1 g<br>0.1 g | 6.5 | 2.5 |
| Comp. Examples | | | | |

TABLE II-continued

| | Photopolymerization Initiator | Sensitivity Steps(1) | LRS(2) |
|---|---|---|---|
| 10 | 2,4,6-tris(trichloro-methyl)-s-triazine | 0.1 g | N.I. | 600< |
| 11 | 2-(p-chlorophenyl)-4,6-bis(trichloromethyl)-s-triazine | 0.1 g | N.I. | " |
| 12 | 2-(4-acetylphenyl)-4,6-bis(trichloromethyl)-s-triazine | 0.1 g | N.I. | " |
| 13 | Compound No. 13 | 0.1 g | N.I. | " |
| 14 | Compound No. 16 | 0.1 g | N.I. | " |
| 15 | Compound No. 12 | 0.1 g | N.I. | " |

(1): Number of the clear steps observed when the monochromatic light obtained through the BP-49 filter was used.
(2): Sensitivity expressed as mJ/cm², observed when laser rays was used (LRS).
N.I.: No images was formed.

As seen from the results summarized in Table II, it is found that the photopolymerizable compositions in Examples 7 to 9 exhibit extremely high sensitivity as compared with those in Comparative Examples 10 to 15.

What is claimed is:

1. A photopolymerizable composition which comprises at least one polymerizable compound having at least one ethylenically unsaturated bond and at least one photopolymerization initiator and optionally at least one linear organic high molecular weight polymer and the composition is characterized in that the photopolymerization initiator comprises at least one 2,4,6-substituted-1,3,5-triazine compound represented by the following general formula (I):

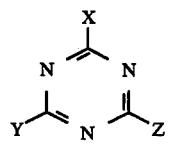

wherein X, Y and Z each represents an alkyl group, a substituted alkyl group, an aryl group, a substituted aryl group or an aralkyl group with the proviso that these may be identical or different and that at least one of these should be mono-, di- or tri-halomethyl group, and at least one compound represented by the following general formula (II):

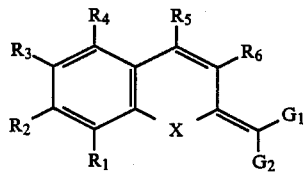

wherein $R_1$ to $R_4$ each independently represents hydrogen atom, a halogen atom, an alkyl group, a substituted alkyl group, an aryl group, a substituted aryl group, hydroxyl group, an alkoxy group, a substituted alkoxy group, amino group or a substituted amino group with the proviso that $R_1$ to $R_4$ may form a non-metallic ring together with the carbon atoms to which these are bonded: $R_5$ and $R_6$ each independently represents hydrogen atom, an alkyl group, a substituted alkyl group, an aryl group, a substituted aryl group, a heteroaromatic group, an acyl group, cyano group, an alkoxycarbonyl group, carboxyl group or a substituted alkenyl group with the proviso that $R_5$ and $R_6$ may form a non-metallic ring together wth the carbon atoms to which these are bonded; X represents oxygen atom, sulfur atom, NH or a bivalent nitrogen atom having a substituent; and $G_1$ and $G_2$ may be identical or different and each represents hydrogen atom, cyano group, an alkoxycarbonyl group, a substituted alkoxycarbonyl group, an aryloxycarbonyl group, a substituted aryloxycarbonyl group, an acyl group, a substituted acyl group, an arylcarbonyl group, a substituted arylcarbonyl group, an alkylthio group, an arylthio group, an alkylsulfonyl group, an arylsulfonyl group or a fluorosulfonyl group with the proviso that $G_1$ and $G_2$ cannot simultaneously represent hydrogen atom and that these may form a non-metallic ring together with the carbon atoms to which these are bonded.

2. A photopolymerizable composition according to claim 1 wherein the amount of the polymerizable compound having at least one ethylenically unsaturated bond is in the range of from 5 to 50% by weight on the basis of the total weight of the composition.

3. A photopolymerizable composition according to claim 2 wherein the amount of the polymerizable compound having at least one ethylenically unsaturated bond ranges from 10 to 40% by weight.

4. A photopolymerizable composition according to claim 1 wherein, in the compound represented by the general formula (II), the alkyl group appearing in the definition of $R_1$ to $R_6$ is one having 1 to 20 carbon atoms; the aryl group thereof is one having 6 to 10 carbon atoms; the alkoxy group appearing in the definition of $R_1$ to $R_4$ is selected from those having 1 to 6 carbon atoms; the substituted amino group therein is selected from alkylamino groups having 1 to 20 carbon atoms or arylamino groups having 6 to 20 carbon atoms, these alkyl, aryl, alkoxy, alkylamino and arylamino groups may have substituents selected from the group consisting of halogen atoms, alkoxycarbonyl groups, alkoxy groups, aryl groups and cyano group; compound (II) including the non-metallic ring formed from $R_1$ to $R_4$ together with the carbon atoms to which these are bonded is one represented by the following general formula (A), (B) or (C):

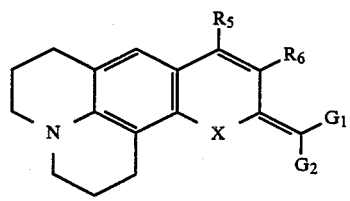

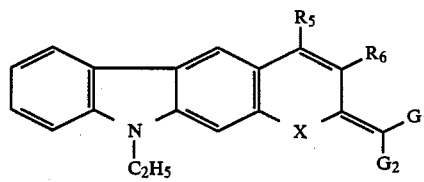

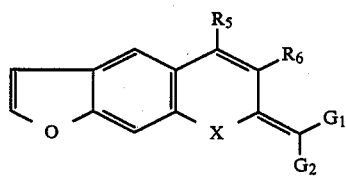

the acyl group appearing in the definition of $R_5$ and $R_6$ is selected from those having an alkyl group of 1 to 10 carbon atoms or an aryl group of 6 to 10 carbon atoms; the alkoxycarbonyl group therein is selected from those having an alkyl group of 1 to 6 carbon atoms; the substituted alkenyl group is selected from those having 2 to 10 carbon atoms; the heteroaromatic group therein is selected from those represented by the following formula (D), (E) or (F):

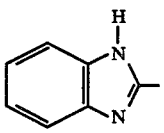

(D)

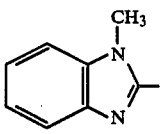

(E)

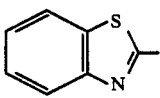

(F)

compound (II) including the non-metallic ring formed from $R_5$ and $R_6$ together with the carbon atoms to which these are bonded is one represented by the following general formula (G):

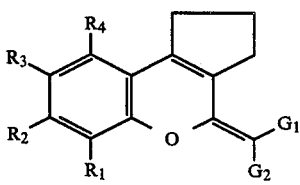

(G)

(wherein the substituents are the same as those defined above); the nitrogen atom having a substituent appearing in the definition of X is selected from those having the same alkyl or aryl group as defined above in connection to $R_1$ to $R_6$.

5. A photopolymerizable composition according to claim 1 wherein, in the general formula (II), $G_1$ and $G_2$ may be identical or different and each represents hydrogen atom, cyano group, an alkoxycarbonyl group having an alkyl group of 1 to 10 carbon atoms, an aryloxycarbonyl group having an aryl group of 6 to 10 carbon atoms, an acyl group having 1 to 6 carbon atoms, an arylcarbonyl group having 7 to 11 carbon atoms, an alkylthio group having 1 to 6 carbon atoms, an arylthio group having 6 to 10 carbon atoms, an arylsulfonyl group having 6 to 10 carbon atoms, an alkylsulfonyl group having 1 to 6 carbon atoms or a fluorosulfonyl group, these alkoxycarbonyl, aryloxycarbonyl, acyl, arylcarbonyl, alkylthio, arylthio, arylsulfonyl and alkylsulfonyl groups may have substituents selected from the group consisting of halogen atoms, alkoxycarbonyl groups having an alkyl group of 1 to 6 carbon atoms, carboxyl group, aryl groups having 6 to 10 carbon atoms, alkoxy groups having 1 to 6 carbon atoms, cyano group or alkyl groups having 1 to 6 carbon atoms; and the non-metallic ring formed from $G_1$ and $G_2$ together with the carbon atom to which these are bonded is one selected from the group consisting of 1,3-dicarbonyl nucleus, pyrazolinone nucleus, isoxazolinone nucleus, oxyindole nucleus, 2,4,6-triketohexahydropyrimidine nucleus, 2-thio-2,4-thiazolidinedione nucleus, 2-thio-2,4-oxazolidinedione nucleus, thianaphthenone nucleus, 2-thio-2,5-thiazolidinedione nucleus, 2,4-thiazolidinedione nucleus, thiazolidinone nucleus, 4-thiazolinone nucleus, 2-imino-2-oxozolin-4-one nucleus, 2,4-imidazolidinedione nucleus, 2-thio-2,4-imidazolidinedione nucleus, 2-imidazolin-5-one nucleus and furan-5-one nucleus.

6. A photopolymerizable composition according to claim 1 wherein the amount of the photopolymerization initiator system is in the range of from 0.01 to 60% by weight on the basis of the total weight of the polymerizable ethylenically unsaturated compound and the linear high molecular weight polymer optionally added.

7. A photopolymerizable composition according to claim 6 wherein the amount of the photopolymerization initiator system ranges from 1 to 30% by weight.

8. A photopolymerizable composition according to claim 1 wherein it further comprises an organic amine in an amount of about 50 to about 200% by weight on the basis of the total weight of the photopolymerization initiator.

9. A photopolymerizable composition according to claim 1 wherein it further comprises a compound serving as a proton donor in an amount of about 50 to about 100% by weight on the basis of the total weight of the photopolymerization initiator.

10. A photopolymerizable composition according to claim 1 wherein the linear organic high molecular weight polymer optionally added is soluble in water or a weak alkaline aqueous solution or capable of swelling in water or an alkaline aqueous solution.

11. A photopolymerizable composition according to claim 1 wherein the amount of the linear organic high molecular weight polymer is in the range of from about 30 to about 85% by weight on the basis of the total weight of the composition.

12. A photopolymerizable composition according to claim 11 wherein the weight ratio of the photopolymerizable ethylenically unsaturated compound to the linear organic high molecular weight polymer ranges from 0.5/9.5 to 5/5.

13. A photopolymerizable composition according to claim 12 wherein the weight ratio therebetween falls within the range of from 1/9 to 4/6.

14. A photopolymerizable composition according to claim 1 wherein it further comprises a heat polymerization inhibitor selected from the group consisting of hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylene-bis(4-methyl-6-tert-butylphenol) and 2-mercaptobenzoimidazole, cerium(III) N-nitrosophenylhydroxylamine.

15. A photopolymerizable composition according to claim 1 wherein the amount of the heat polymerization inhibitor is in the range of from about 0.01 to about 5% by weight on the basis of the total weight of the composition.

16. A photopolymerizable composition according to claim 1 wherein it further comprises a higher aliphatic acid derivative.

17. A photopolymerizable composition according to claim 16 wherein the amount of the higher aliphatic acid derivative is in the range of from about 0.5 to about 10% by weight of the total weight of the composition.

18. A photopolymerizable composition according to claim 1 wherein it comprises a dye or a pigment in an amount of from about 0.5 to about 5% by weight of the total weight of the photopolymerizable composition.

* * * * *